(12) United States Patent
Ahn et al.

(10) Patent No.: US 12,240,701 B2
(45) Date of Patent: Mar. 4, 2025

(54) APPARATUS FOR TRANSPORTING CONTAINER AND SYSTEM FOR STORING CONTAINER WITH THE APPARATUS

(71) Applicant: SEMES Co., Ltd., Chungcheongnam-do (KR)

(72) Inventors: Jun Sang Ahn, Gyeonggi-do (KR); Sun Oh Kim, Gyeonggi-do (KR); Chan Young Noh, Seoul (KR)

(73) Assignee: SEMES Co., Ltd., Chungcheongnam-do (KR)

( * ) Notice: Subject to any disclaimer, the term of this patent is extended or adjusted under 35 U.S.C. 154(b) by 781 days.

(21) Appl. No.: 17/474,285

(22) Filed: Sep. 14, 2021

(65) Prior Publication Data

US 2022/0135332 A1 May 5, 2022

(30) Foreign Application Priority Data

Nov. 5, 2020 (KR) .......................... 10-2020-0147013

(51) Int. Cl.
*B65G 1/137* (2006.01)
*H01L 21/673* (2006.01)
*H01L 21/677* (2006.01)

(52) U.S. Cl.
CPC ...... *B65G 1/1375* (2013.01); *H01L 21/67353* (2013.01); *H01L 21/6773* (2013.01);
(Continued)

(58) Field of Classification Search
CPC .......... B65G 1/1375; B65G 2201/0235; B65G 1/0457; B65G 2201/0297;
(Continued)

(56) References Cited

U.S. PATENT DOCUMENTS 11,052,926 B2 7/2021 Imahori
2007/0134078 A1 6/2007 Rogers et al.
(Continued)

FOREIGN PATENT DOCUMENTS

JP 2018177376 A 11/2018
KR 20200043909 A 4/2020
(Continued)

OTHER PUBLICATIONS

Korean Request for the Submission of an Opinion for Korean Application No. 10-2020-0147013, dated Jun. 30, 2023 with translation, 16 pages.
(Continued)

*Primary Examiner* — Thomas Randazzo
(74) *Attorney, Agent, or Firm* — Buchanan Ingersoll & Rooney PC

(57) ABSTRACT

Provided are a container transporting apparatus for storing items such as FOUPs and reticle pods by utilizing the dead zone space located in an upper portion of the semiconductor manufacturing facility built in the FAB, and a container storage system having the same. The container storage system may include a first storage unit installed on a side of a movement path of a transporting device for transporting a container accommodating a substrate and for storing the container; a second storage unit installed on a side of the first storage unit and for storing the container; and a transporting unit moving between the first storage unit and the second storage unit and for transporting the container stored in the first storage unit to the second storage unit.

16 Claims, 11 Drawing Sheets

(52) U.S. Cl.
CPC ............... *H01L 21/67733* (2013.01); *H01L 21/67763* (2013.01); *H01L 21/67769* (2013.01); *B65G 2201/0235* (2013.01)

(58) Field of Classification Search
CPC ......... H01L 21/67727; H01L 21/67733; H01L 21/67769; H01L 21/6773; H01L 21/673; H01L 21/67763; H01L 21/67706; H01L 21/67736
See application file for complete search history.

(56) References Cited

U.S. PATENT DOCUMENTS

| | | | |
|---|---|---|---|
| 2015/0004899 A1* | 1/2015 | Otsuka | H01L 21/67017 454/341 |
| 2016/0126120 A1 | 5/2016 | Oza et al. | |
| 2016/0332815 A1* | 11/2016 | Ueda | H01L 21/67389 |
| 2020/0126823 A1 | 4/2020 | Teramoto et al. | |
| 2020/0264506 A1* | 8/2020 | Sasaki | B65G 1/137 |
| 2022/0073275 A1 | 3/2022 | Wada et al. | |
| 2022/0081207 A1 | 3/2022 | Wada | |

FOREIGN PATENT DOCUMENTS

| | | |
|---|---|---|
| WO | 2018055883 A1 | 3/2018 |
| WO | 2020137225 A1 | 7/2020 |
| WO | 2020153041 A1 | 7/2020 |

OTHER PUBLICATIONS

Korean Request for the Submission of an Opinion for Korean Application No. 10-2020-0147013, dated Nov. 30, 2022 with translation, 16 pages.

* cited by examiner

[FIG. 1]
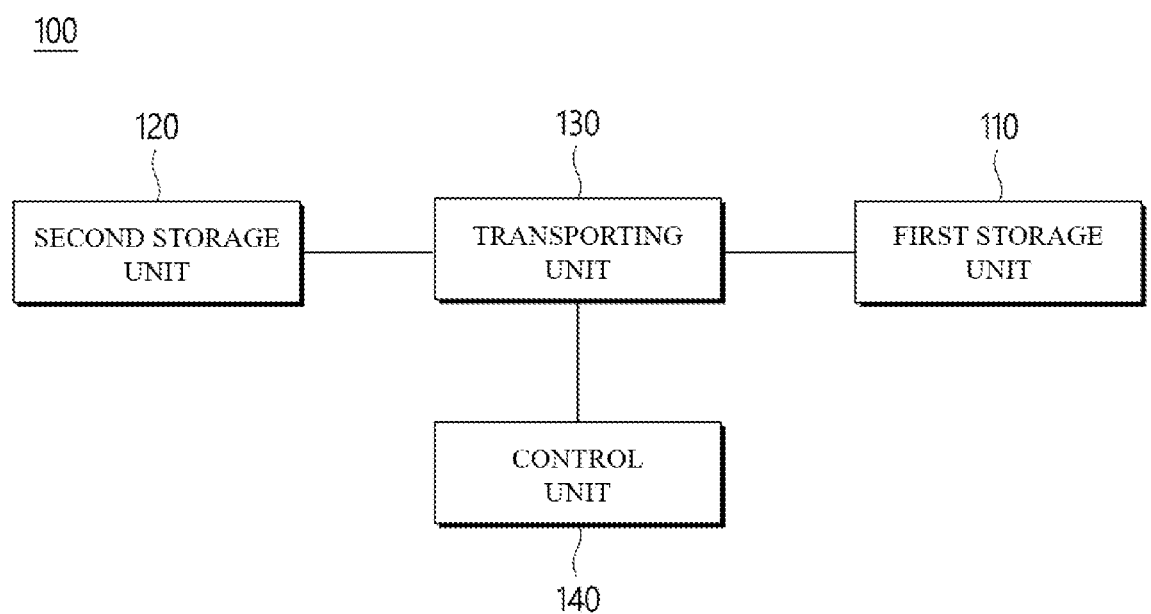

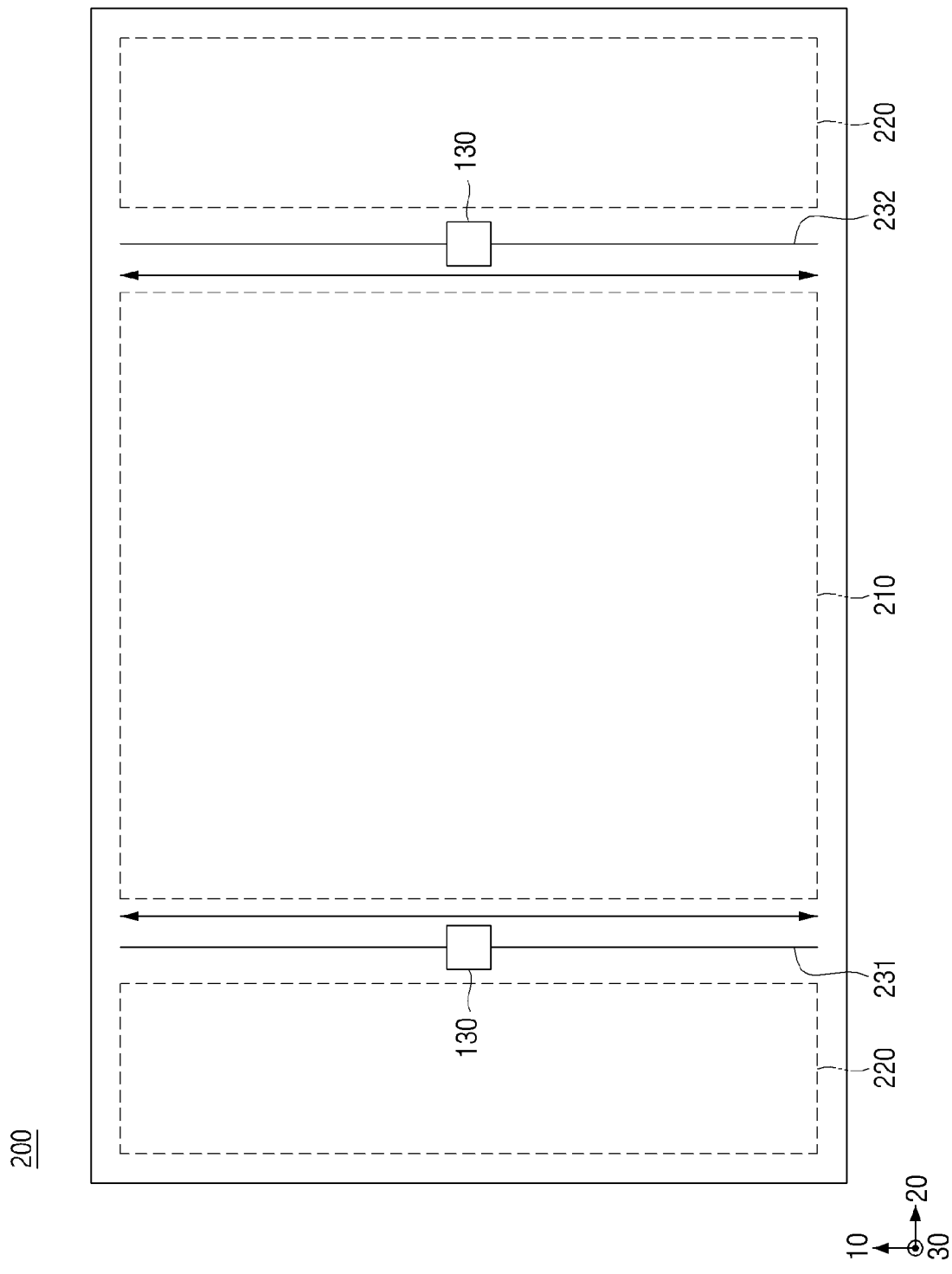

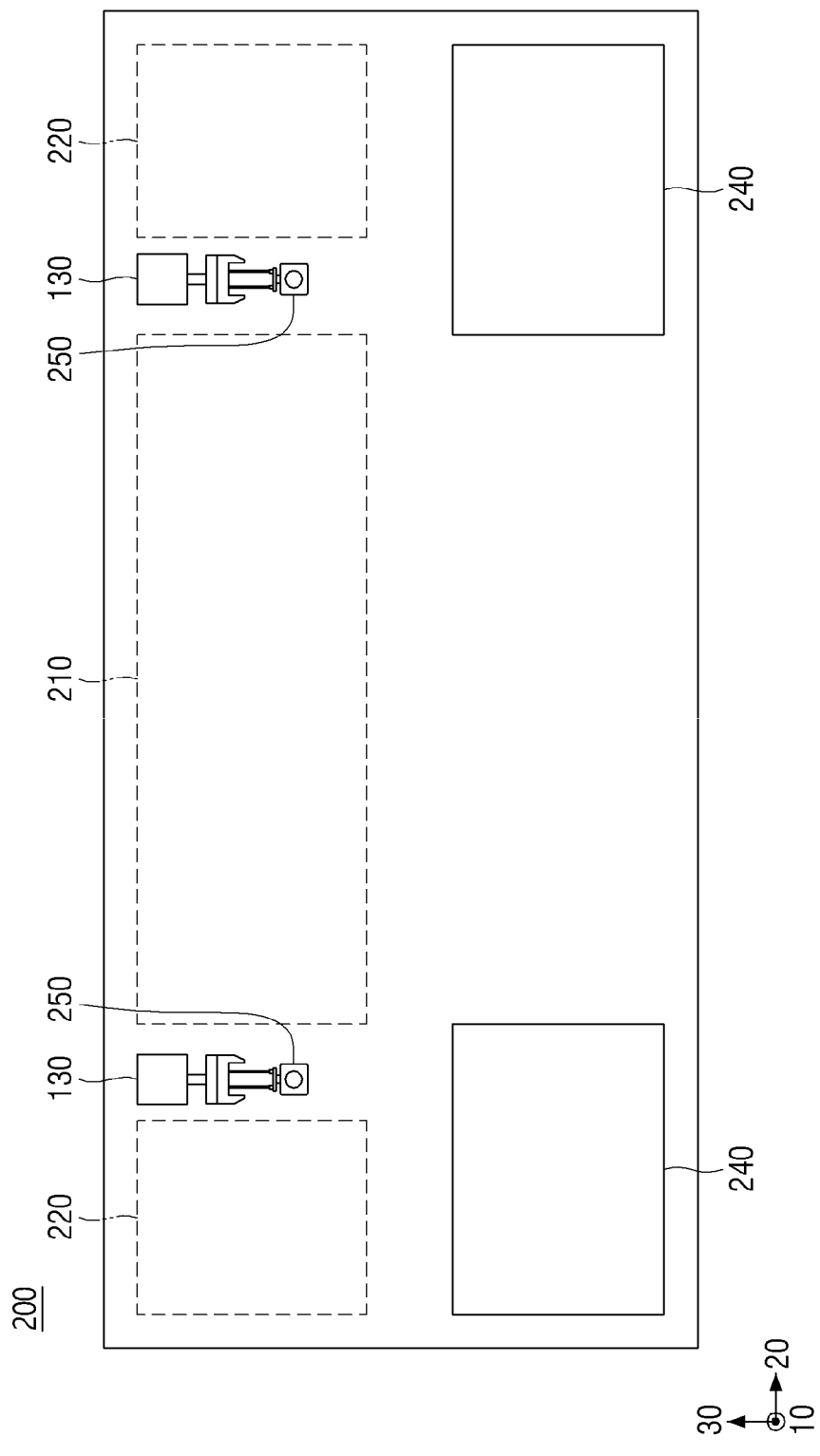
[FIG. 3]

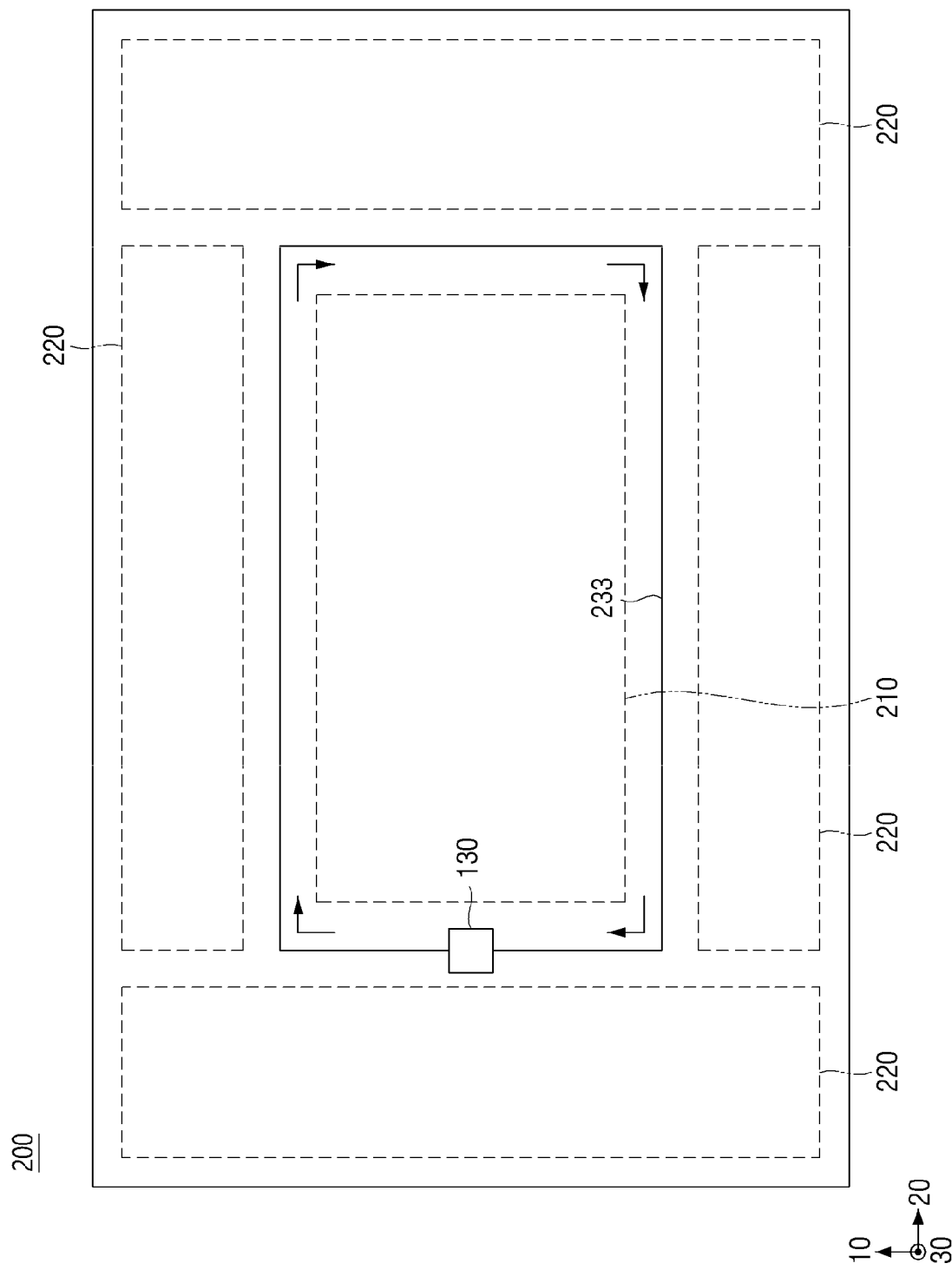
[FIG. 4]

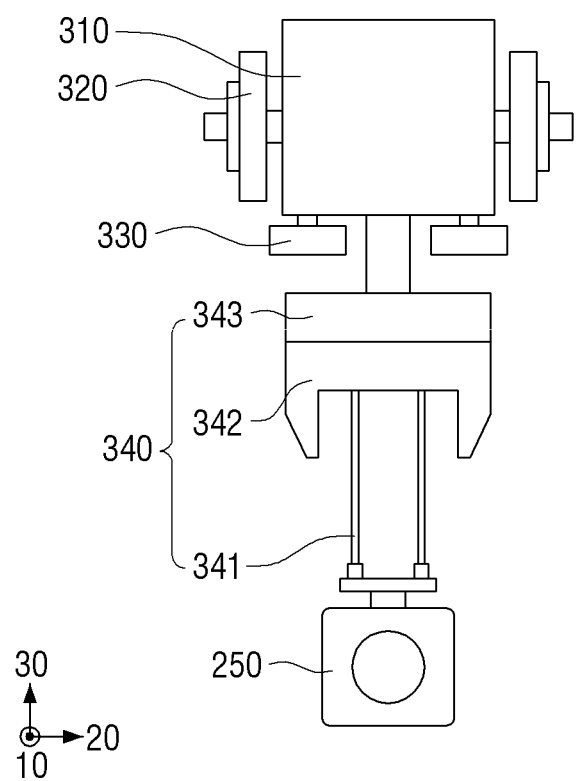
[FIG. 5]

[FIG. 6]
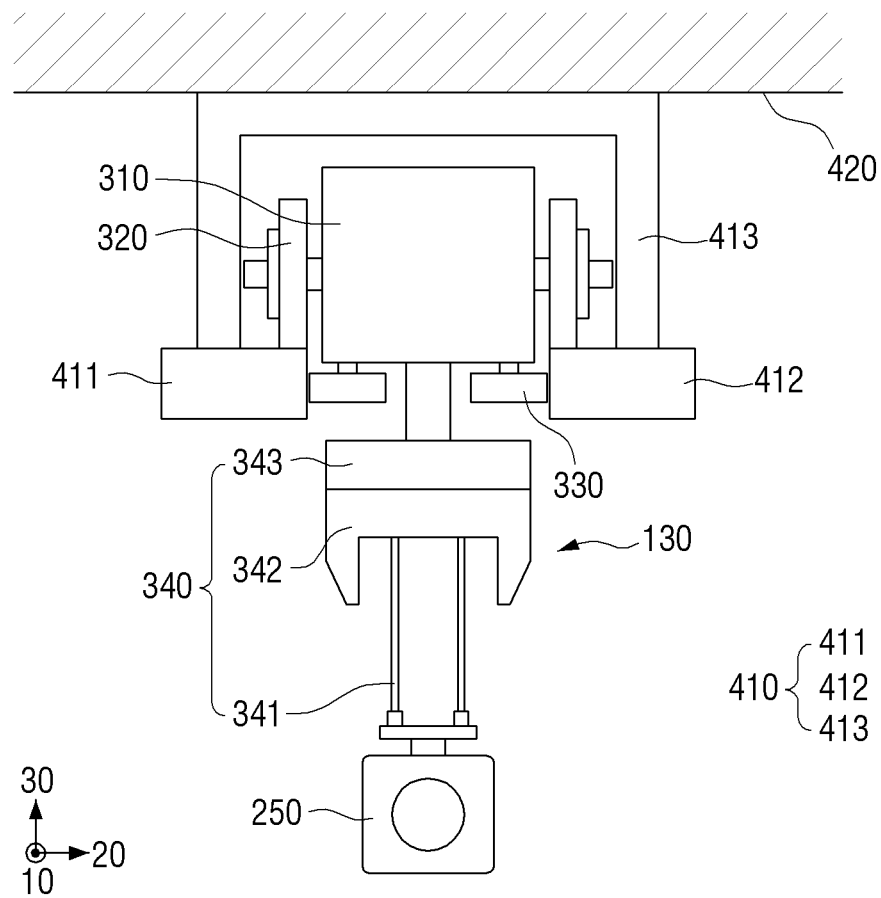
[FIG. 7]
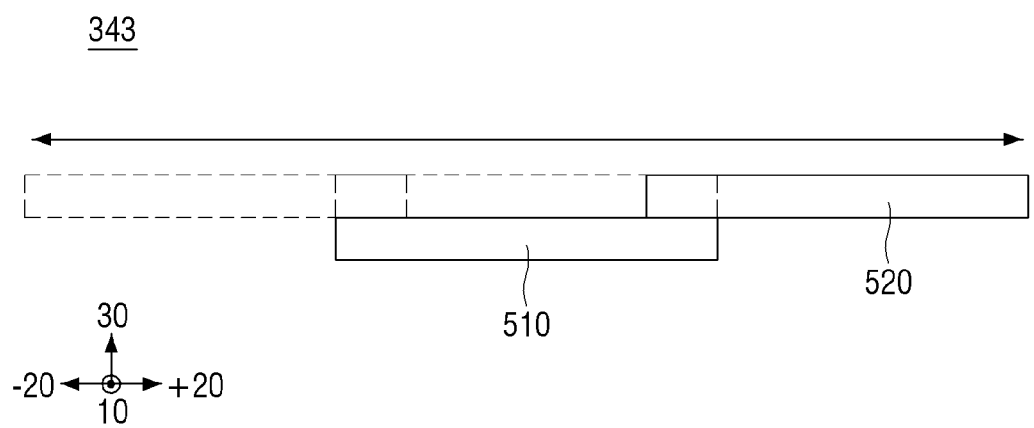

[FIG. 8]
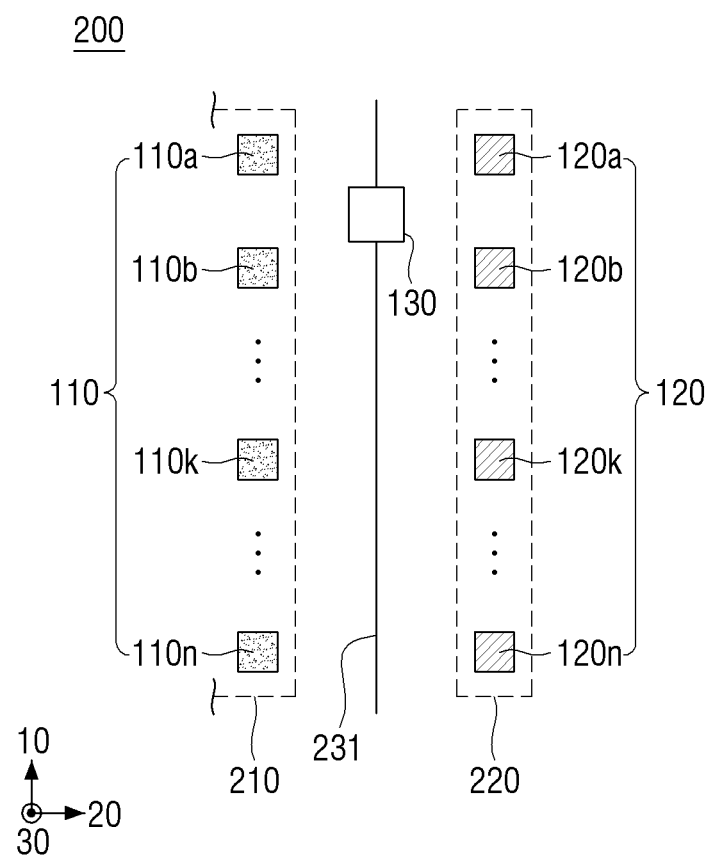

[FIG. 9]
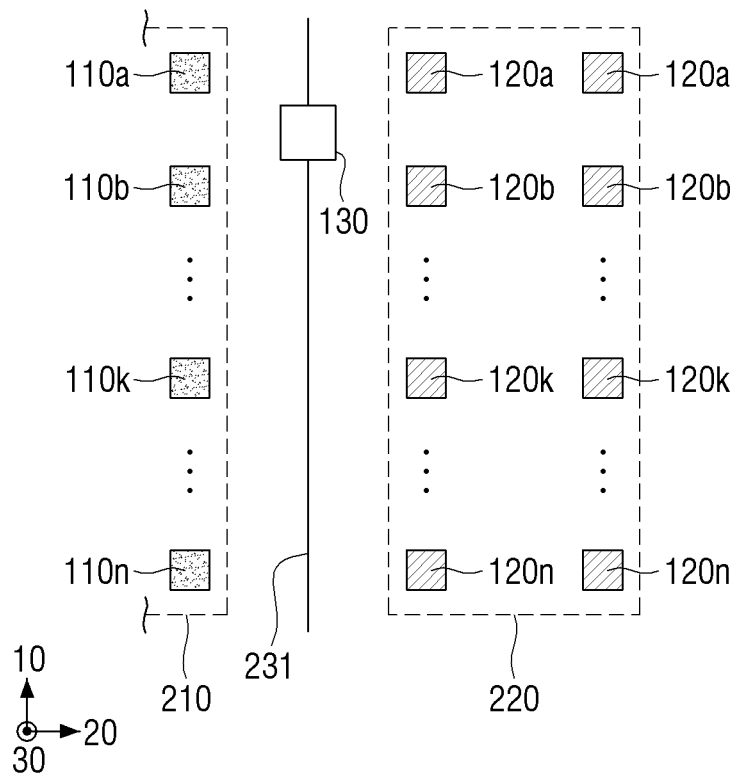
[FIG. 10]
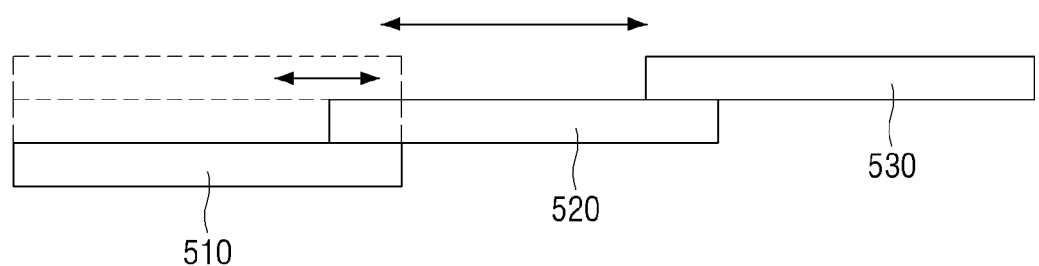

[FIG. 11]
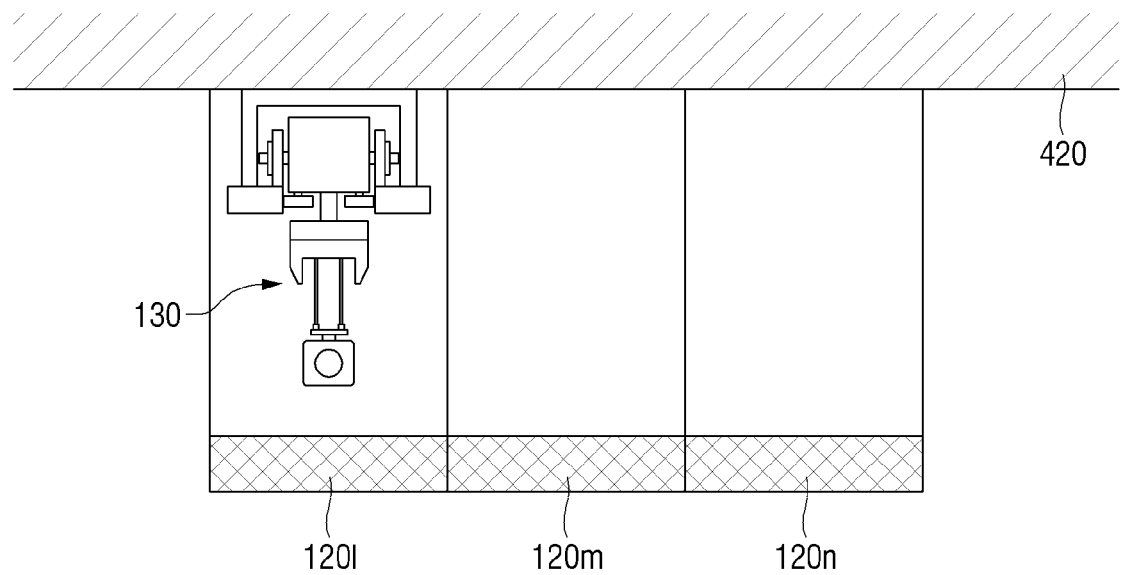
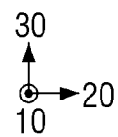

[FIG. 12]
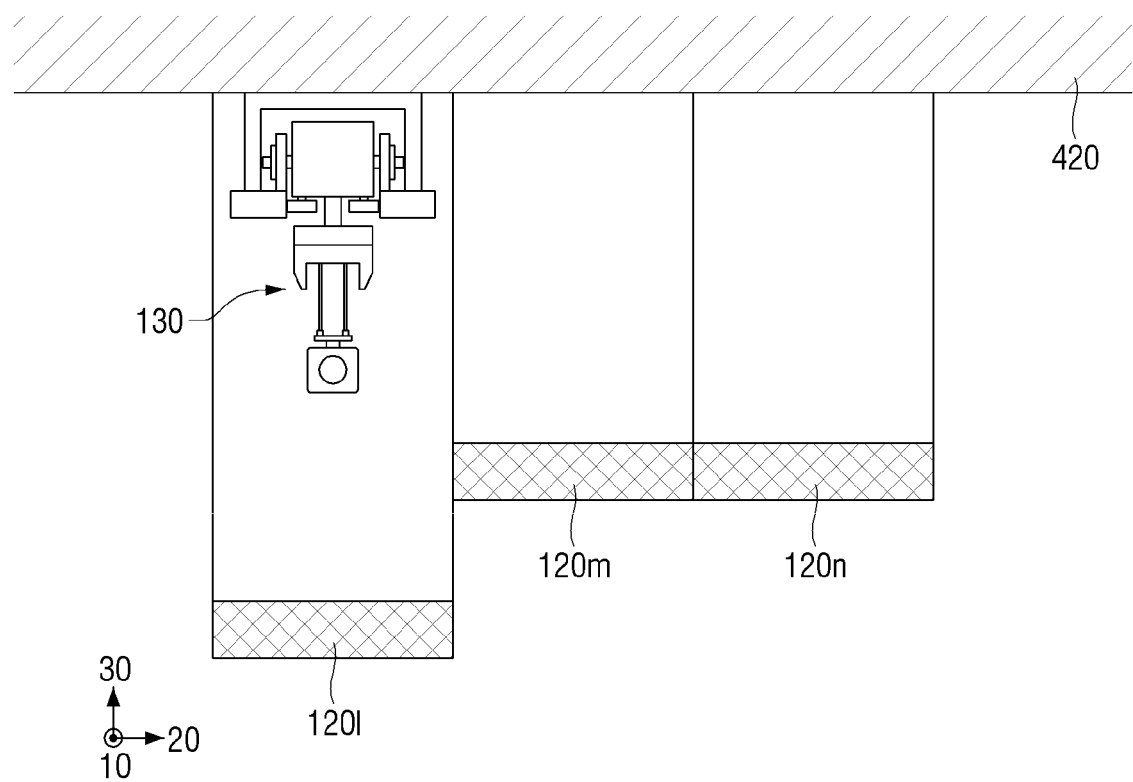

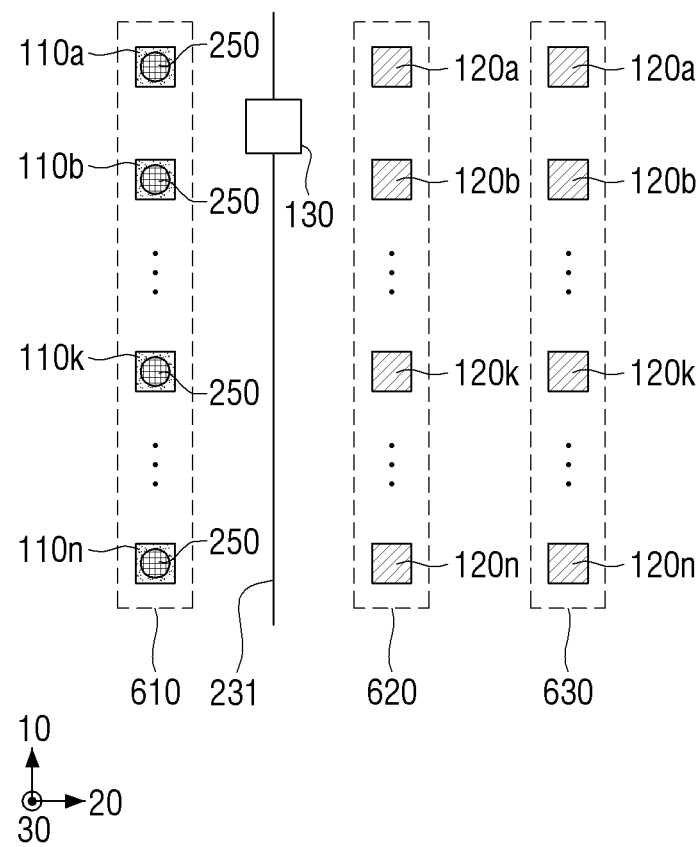
[FIG. 13]

APPARATUS FOR TRANSPORTING CONTAINER AND SYSTEM FOR STORING CONTAINER WITH THE APPARATUS

CROSS REFERENCE TO RELATED APPLICATION

This application claims the benefit of Korean Patent Application No. 10-2020-0147013, filed on Nov. 5, 2020, in the Korean Intellectual Property Office, the disclosure of which is incorporated herein by reference in its entirety.

FIELD OF THE INVENTION

The present invention relates to a container transporting apparatus and a container storage system having the same. More particularly, it relates to a container transporting apparatus that can be applied to a space, in which a semiconductor manufacturing facility is built, and a container storage system having the same.

DESCRIPTION OF THE RELATED ART

The process of manufacturing a semiconductor device may be continuously performed in a semiconductor manufacturing facility, and may be divided into a pre-process and a post-process. A semiconductor manufacturing facility may be installed in a space generally defined as a FAB for manufacturing semiconductor devices.

The pre-process refers to a process of forming a circuit pattern on a wafer to complete a chip. The pre-process may include a deposition process for forming a thin film on a wafer, a photo-lithography process for transferring a photo resist onto a thin film using a photo mask, an etching process for selectively removing unnecessary parts using chemical substances or reactive gases to form a circuit pattern on a wafer, an ashing process for removing the photo resist remaining after etching, an ion implantation process for implanting ions into the portion connected to the circuit pattern to have characteristics of an electronic device, a cleaning process for removing contamination sources from the wafer, and the like.

The post-process refers to the process of evaluating the performance of the product finished through the pre-process. The post-process may include a wafer inspection process that checks whether each chip on the wafer operates and selects good and bad products, a package process that cuts and separates each chip through dicing, die bonding, wire bonding, molding and marking to have the shape of the product, and the final inspection process that finally checks the product characteristics and reliability through electrical property inspection, and burn-in inspection.

SUMMARY OF THE INVENTION

A stocker is to store items such as a front opening unified pod (FOUP) that accommodates wafers and a reticle pod that accommodates reticles. Such a stocker may be installed on the ground in a FAB, in which a semiconductor manufacturing facility is built.

The stocker may include a plurality of shelves for loading goods, and a crane that moves along the shelves. However, if the number of items to be stored increases, the space occupied by the stocker in the FAB also increases, thereby reducing the efficiency of space utilization of the FAB.

The problem to be solved in the present invention is to provide a container transporting device for storing items such as FOUPs and reticle pods by utilizing a dead zone space located in the upper portion of a semiconductor manufacturing facility built in a FAB, and a container storage system having the same.

The problems of the present invention are not limited to the problems mentioned above, and other problems not mentioned will be clearly understood by those skilled in the art from the following description.

One aspect of the container storage system of the present invention for achieving the above object comprises a first storage unit installed on a side of a movement path of a transporting device for transporting a container accommodating a substrate and for storing the container; a second storage unit installed on a side of the first storage unit and for storing the container; and a transporting unit moving between the first storage unit and the second storage unit and for transporting the container stored in the first storage unit to the second storage unit.

Wherein the second storage unit may be installed in an upper portion of a semiconductor manufacturing facility in a space, in which the semiconductor manufacturing facility is built.

Wherein an upper portion of a space, in which a semiconductor manufacturing facility is built, includes a first area and at least one second area arranged outside the first area, and the second storage unit may be installed in the second area.

Wherein the second area may be arranged on both sides of the first area, or may be arranged on a periphery of the first area.

Wherein the second storage unit may be arranged along at least one column, and the transporting unit may transport the container using a stroke.

Wherein a plurality of second storage units are arranged along a plurality of columns, and a second storage unit arranged along any one of the plurality of columns may be formed to have a different height from a second storage unit arranged along other one of the plurality of columns.

Wherein the transporting unit may be installed in an upper portion of a second storage unit arranged along any one of the plurality of columns.

Wherein the transporting unit may comprise a driving wheel that rotates along a rail; a driving control unit coupled to the driving wheel on its both sides and for controlling the driving wheel; and a body unit coupled to a lower portion of the driving control unit and including a gripping unit for gripping the container, a first moving control unit for moving the gripping unit in upward and downward directions, and a second moving control unit for moving the gripping unit in a lateral direction.

Wherein the second moving control unit may comprise a plate structure elongated in the lateral direction; and a first sliding member installed to be movable in the lateral direction on the plate structure.

Wherein the second moving control unit may further comprise a second sliding member installed to be movable in the lateral direction on the first sliding member.

Wherein at least one second sliding member is installed on the first sliding member, and a plurality of second sliding members may be stacked and installed to be movable in the lateral direction when the plurality of second sliding members are installed on the first sliding member.

Wherein the transporting unit may transport the container by using a movement path of the transporting device.

Wherein the transporting unit may transport the container when there is no or one first storage unit, in which the container is stored, among a plurality of first storage units.

Wherein at least one unit of a plurality of first storage units is an interface unit, and the transporting unit may transport the container to the second storage unit when the container is stored in the interface unit.

Wherein a plurality of second storage units are arranged along a plurality of columns, and the transporting unit may first transport the container to a second storage unit located in an outer column.

Wherein a plurality of second storage units are arranged along a plurality of columns, and the transporting unit may transport a container for long term storage to a second storage unit located in an outer column, and may transport a container for short term storage to a second storage unit located in an inner column.

Wherein the transporting unit may transport the container based on any one of a storage location of the container, a storage order of the container, and a processing order of the container.

Wherein the first storage unit, the second storage unit, and the transporting unit may be installed at a lower position than a sprinkler in a space, in which a semiconductor manufacturing facility is built.

Another aspect of the container storage system of the present invention for achieving the above object comprises a first storage unit installed on a side of a movement path of a transporting device for transporting a container accommodating a substrate and for storing the container; a second storage unit installed on a side of the first storage unit and for storing the container; and a transporting unit moving between the first storage unit and the second storage unit, and for transporting the container stored in the first storage unit to the second storage unit, wherein the second storage unit is installed in an upper portion of a semiconductor manufacturing facility in a space, in which the semiconductor manufacturing facility is built, and is arranged along at least one column, wherein the transporting unit transports the container using a stroke.

One aspect of the container transporting apparatus of the present invention for achieving the above object moving between a first storage unit installed on a side of a movement path of a transporting device and a second storage unit installed on a side of the first storage unit, wherein the container transporting apparatus comprises a driving wheel rotating along a rail; a driving control unit coupled to the driving wheel on its both sides and for controlling the driving wheel; and a body unit coupled to a lower portion of the driving control unit and including a gripping unit for gripping the container, a first moving control unit for moving the gripping unit in upward and downward directions, and a second moving control unit for moving the gripping unit in a lateral direction, wherein the container stored in the first storage unit is transported to the second storage unit using a stroke of the second moving control unit.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which:

FIG. 1 is a conceptual diagram schematically illustrating an internal configuration of a container storage system according to an embodiment of the present invention;

FIG. 2 is a plan view illustrating an installation environment of a container storage system according to an embodiment of the present invention;

FIG. 3 is a side view illustrating an installation environment of a container storage system according to an embodiment of the present invention;

FIG. 4 is a plan view illustrating an installation position of a container storage system according to another embodiment of the present invention;

FIG. 5 is a diagram schematically illustrating a structure of a transporting unit constituting a container storage system according to an embodiment of the present invention;

FIG. 6 is a view schematically illustrating an installation form of the transporting unit shown in FIG. 5;

FIG. 7 is a first exemplary diagram schematically illustrating an internal structure of a second moving control unit constituting the transporting unit shown in FIG. 5;

FIG. 8 is a first exemplary diagram illustrating an arrangement structure when a plurality of first and second storage units constituting a container storage system according to an embodiment of the present invention are provided;

FIG. 9 is a second exemplary diagram illustrating an arrangement structure when a plurality of first and second storage units constituting a container storage system according to an embodiment of the present invention are provided;

FIG. 10 is a second exemplary diagram schematically illustrating an internal structure of a second moving control unit constituting the transporting unit shown in FIG. 5;

FIG. 11 is a first exemplary diagram illustrating an installation environment of a second storage unit constituting a container storage system according to an embodiment of the present invention;

FIG. 12 is a second exemplary diagram illustrating an installation environment of a second storage unit constituting a container storage system according to an embodiment of the present invention; and FIG. 13 is an exemplary view for describing a method of operating a control unit constituting a container storage system according to an embodiment of the present invention.

DETAILED DESCRIPTION OF THE INVENTION

Hereinafter, preferred embodiments of the present invention will be described in detail with reference to the accompanying drawings. Advantages and features of the present invention, and methods for achieving them will be clarified with reference to embodiments described below in detail together with the accompanying drawings. However, the present invention is not limited to the embodiments disclosed below, but may be implemented in various different forms, and only the embodiments allow the publication of the present invention to be complete, and are provided to fully inform those skilled in the technical field to which the present invention pertains of the scope of the invention, and the invention is only defined by the scope of the claims. The same reference numerals refer to the same elements throughout the specification.

When elements or layers are referred to as "on" or "above" of other elements or layers, it includes not only when directly above of the other elements or layers, but also other elements or layers intervened in the middle. On the other hand, when elements are referred to as "directly on" or "directly above," it indicates that no other element or layer is intervened therebetween.

The spatially relative terms "below," "beneath," "lower," "above," "upper," etc., as shown in figures, can be used to easily describe the correlation of components or elements with other components or elements. The spatially relative terms should be understood as terms including the different direction of the element in use or operation in addition to the direction shown in the figure. For example, if the element shown in the figure is turned over, an element described as "below" or "beneath" the other element may be placed "above" the other element. Accordingly, the exemplary term "below" can include both the directions of below and above. The element can also be oriented in other directions, so that spatially relative terms can be interpreted according to the orientation.

Although the first, second, etc. are used to describe various components, elements and/or sections, these components, elements and/or sections are not limited by these terms. These terms are only used to distinguish one component, element, or section from another component, element or section. Therefore, first component, the first element or first section mentioned below may be a second component, second element, or second section within the technical spirit of the present invention.

The terminology used herein is for describing the embodiments and is not intended to limit the present invention. In the present specification, the singular form also includes the plural form unless otherwise specified in the phrase. As used herein, "comprises" and/or "comprising" means that the elements, steps, operations and/or components mentioned above do not exclude the presence or additions of one or more other elements, steps, operations and/or components.

Unless otherwise defined, all terms (including technical and scientific terms) used in the present description may be used with meanings that can be commonly understood by those of ordinary skill in the art to which the present invention belongs. In addition, terms defined in a commonly used dictionary are not interpreted ideally or excessively unless explicitly defined specifically.

Hereinafter, exemplary embodiments of the present invention will be described in detail with reference to the accompanying drawings, and in the description with reference to the accompanying drawings, the same or corresponding elements are assigned the same reference numbers regardless of reference numerals, and the description overlapped therewith will be omitted.

The present invention relates to a container transporting apparatus that utilizes the dead zone space located in the upper portion of the semiconductor manufacturing facility built in a FAB to store items such as a FOUP (Front Opening Unified Pod) and reticle pod and a container storage system having the same.

In the present invention, by building a storage that can store items in the dead zone space, and installing a loader that performs a transporting function to be compatible with a STB (Side Track Buffer) and storage, limited storage capacity in the FAB can be expanded, and thus the effect of improving the storage density can be obtained. In addition, the logistics transporting time can be shortened, and the logistics efficiency linked with OHT (Overhead Hoist Transport) can be improved.

Hereinafter, the present invention will be described in detail with reference to drawings and the like.

FIG. 1 is a conceptual diagram schematically illustrating an internal configuration of a container storage system according to an embodiment of the present invention, and FIG. 2 is a plan view illustrating an installation environment of the container storage system according to an embodiment of the present invention. And, FIG. 3 is a side view illustrating an installation environment of a container storage system according to an embodiment of the present invention.

Referring to FIGS. 1 to 3, the container storage system 100 may include a first storage unit 110, a second storage unit 120, a transporting unit 130, and a control unit 140.

The first storage unit 110 is to store the container 250 (e.g., FOUP, reticle pod, etc.). Container 250 may be, for example, a FOUP, a reticle pod, or the like.

At least one first storage unit 110 may be installed in the space 200, in which the semiconductor manufacturing facility 240 is built. The first storage unit 110 may be implemented as, for example, a side track buffer (STB). Meanwhile, the space 200, in which the semiconductor manufacturing facility 240 is built, in the above may be, for example, a FAB, that is, a clean room.

The first storage unit 110 may be installed in the first area 210 in the space 200, in which the semiconductor manufacturing facility 240 is built. In this case, the first area 210 is an upper portion of the space 200, in which the semiconductor manufacturing facility 240 is built, and may be formed in a central area thereof. The semiconductor manufacturing facility 240 may not be arranged under the first area 210.

The first storage unit 110 may receive and store the container 250 from an overhead hoist transport (OHT) (not shown). The first storage unit 110 may be installed around the movement path of the OHT for this purpose. The movement path of the OHT may be built in the first area 210 like the first storage unit 110.

The second storage unit 120 is to store the container 250 like the first storage unit 110. At least one such second storage unit 120 may also be installed in the space 200, in which the semiconductor manufacturing facility 240 is built. The second storage unit 120 may be implemented as, for example, a storage.

The second storage unit 120 may be installed in the second area 220 in the space 200, in which the semiconductor manufacturing facility 240 is built. In this case, the second area 220 is an upper area of the space 200, in which the semiconductor manufacturing facility 240 is built, and may be formed in a side area (i.e., an outer area of the first area 210). A semiconductor manufacturing facility 240 may be arranged under the second area 220.

The second area 220 may be formed on both sides of the first area 210. However, the present embodiment is not limited thereto. The second area 220 may be formed on one side of the first area 210.

Meanwhile, as shown in FIG. 4, the second area 220 may be formed on each side of the first area 210 to surround the first area 210. FIG. 4 is a plan view illustrating an installation position of a container storage system according to another embodiment of the present invention.

It will be described again with reference to FIGS. 1 to 3.

The second storage unit 120 may receive and store the container 250 from the transporting unit 130. In this case, the second storage unit 120 may receive the container 250 using the stroke of the transporting unit 130, and may be installed around the movement path of the transporting unit 130. In this regard, a more detailed description will be provided later.

The transporting unit 130 transports the container 250. The transporting unit 130 may transport the container 250 using a plurality of rails formed between the first area 210 and the second area 220.

The plurality of rails may be installed in the space 200, in which the semiconductor manufacturing facility 240 is built, with the first direction 10 as the longitudinal direction. When the second area 220 is formed on both sides of the first area 210, the first rail 231 and the second rail 232 may be installed on both sides of the first area 210 in the space 200, in which the semiconductor manufacturing facility 240 is built, and may be installed as a line that reciprocates from one point to another point.

However, the present embodiment is not limited thereto. One rail may be installed in the space 200, in which the semiconductor manufacturing facility 240 is built. In this case, the third rail 233 may be installed as a circulating line as shown in FIG. 4, and the second area 220 may be formed on each side of the first area 210.

The transporting unit 130 may transport the container 250 through a reciprocating motion using a reciprocating line, a circulating motion using a circulating line, etc. However, the present embodiment is not limited thereto. The transporting unit 130 may also transport the container 250 through a rotational motion. For example, the transporting unit 130 also may receive the container 250 from the first storage unit 110 located on one side of the first rail 231, and then rotate to transport it to the second storage unit 120 located on the other side of the first rail 231, that is, to the second storage unit 120 located opposite the first storage unit 110 with the first rail 231 interposed therebetween.

Meanwhile, the transporting unit 130 may transport the container 250 to the destination by using a rail provided as a movement path of the OHT.

The transporting unit 130 may transport the container 250 loaded in the first storage unit 110 to the second storage unit 120. However, the present embodiment is not limited thereto. The transporting unit 130 may transport the container 250 loaded in the second storage unit 120 to the first storage unit 110.

The transporting unit 130 may include a driving control unit 310, a driving wheel 320, a guide wheel 330 and a body unit 340 as shown in FIGS. 5 and 6 to transport the container 250.

FIG. 5 is a diagram schematically illustrating a structure of a transporting unit constituting a container storage system according to an embodiment of the present invention, and FIG. 6 is a diagram schematically illustrating an installation form of the transporting unit shown in FIG. 5. The following description refers to FIGS. 5 and 6.

The driving control unit 310 controls the driving wheel 320 moving along the pair of rails 411 and 412. The driving control unit 310 may be coupled to a pair of driving wheels 320 through both sides thereof, and may also be coupled to the body unit 340 through the lower portion thereof. The driving control unit 310 may also serve to support the body unit 340 located in a lower portion thereof.

Although not shown in detail in FIGS. 5 and 6, the driving control unit 310 may include a driving motor, a driving shaft, and a speed adjusting unit. Here, the driving motor generates a driving force, and the driving shaft transmits the driving force generated by the driving motor to the driving wheel 320. Also, the speed adjusting unit adjusts the rotation speed of the driving wheel 320.

When the driving control unit 310 is configured to include a driving motor, a driving shaft, a speed adjusting unit, etc., it may provide a driving force to the driving wheel 320 through a driving motor, a driving shaft, etc. and may control the rotation speed of the driving wheel 320 through a speed adjusting unit.

The driving wheel 320 rotates on the pair of rails 411 and 412 using driving force provided from the driving control unit 310. At least one pair of driving wheels 320 may be installed on both sides of the driving control unit 310 for this purpose.

The guide wheel 330 is for preventing the transporting unit 130 from being separated from the pair of rails 411 and 412 when the transporting unit 130 travels on the pair of rails 411 and 412. For this purpose, at least one pair of guide wheels 330 may be installed on both sides of the lower surface of the driving control unit 310 in a direction perpendicular to the driving wheel 320.

The rail assembly 410 is for providing a movement path to the transporting unit 130. The rail assembly 410 may include a pair of rails 411 and 412 and a rail support unit 413.

The pair of rails 411 and 412 provides a path through which the transporting unit 130 can move. The first rail 231, the second rail 232, and the third rail 233 described with reference to FIGS. 2 and 3 may be implemented as a pair of rails 411 and 412 as shown in FIG. 4. The pair of rails 411 and 412 may be installed on the ceiling 420 of the space 200, in which the semiconductor manufacturing facility 240 is built.

A rail support unit 413 may be installed together with a pair of rails 411 and 412 on the ceiling 420 of the space 200, in which the semiconductor manufacturing facility 240 is built. At this time, the pair of rails 411 and 412 may be respectively coupled to both sides of the rail support unit 413 fixed to the ceiling 420.

The pair of rails 411 and 412 may be formed in a straight section to reciprocate between one point and another point. However, the present embodiment is not limited thereto. The pair of rails 411 and 412 may be formed to have a mixture of various types of sections, such as straight sections, curved sections, inclined sections, branch sections, and intersection sections, depending on the layout in the space 200, in which the semiconductor manufacturing facility 240 is built.

The rail support unit 413 is installed on the ceiling 420 of the space 200, in which the semiconductor manufacturing facility 240 is built, to support the pair of rails 411 and 412. The rail support unit 413 may be formed in a cap shape.

The body unit 340 may include a gripping unit 341, a first moving control unit 342, and a second moving control unit 343.

The gripping unit 341 grips the container 250. The gripping unit 341 may descend in the third direction 30 by the first moving control unit 342 to grip the container 250 located in the downward direction of the transporting unit 130. The griping unit 341 may be implemented as, for example, a hand gripper.

The first moving control unit 342 elevates the gripping unit 341 in the third direction 30 so that the gripping unit 341 can grip the container 250. The first moving control unit 342 may lower the gripping unit 341 in the negative third direction 30 (i.e., the direction of the bottom surface of the space 240, in which the semiconductor manufacturing facility 240 is built), and when the gripping unit 341 grips the container 250, it may raise the gripping unit 341 in the positive third direction 30 (i.e., the ceiling direction of the space 240, in which the semiconductor manufacturing facility 240 is built). The first moving control unit 342 may be implemented as, for example, a hoist.

The second moving control unit 343 moves the griping unit 341 and the first moving control unit 342 in the second direction 20. The second moving control unit 343 may be coupled to the upper portion of the first moving control unit 342 for this purpose. The second moving control unit 343 may be implemented as, for example, a slider.

The second moving control unit 343 may be configured to include the plate structure 510 and the first sliding member 520 as shown in FIG. 7 to move the gripping unit 341 and the first moving control unit 342 in the second direction 20.

FIG. 7 is a first exemplary diagram schematically illustrating an internal structure of a second moving control unit constituting the transporting unit shown in FIG. 5. The following description refers to FIG. 7.

The plate structure 510 may be formed on the first moving control unit 342 with the second direction 20 as the longitudinal direction.

The first sliding member 520 is installed to be movable in the second direction 20 on the plate structure 510. The first sliding member 520 may move in the second direction 20 on the plate structure 510 using a motor.

In the present embodiment, the first storage unit 110 and the second storage unit 120 may be arranged on both sides of the transporting unit 130. FIG. 8 is a first exemplary diagram illustrating an arrangement structure when a plurality of first and second storage units constituting a container storage system according to an embodiment of the present invention are provided. The following description refers to FIGS. 7 and 8.

The first storage unit 110 may receive and store the container 250 from the OHT as described above. At this time, the plurality of first storage units 110a, 110b, ..., 110k, ..., 110n may be arranged in one column along the longitudinal direction of the first rail 231 on one side of the first rail 231.

The second storage unit 120 may receive and store the container 250 from the transporting unit 130 as described above. In this case, the plurality of second storage units 120a, 120b, ..., 120k, ..., 120n may be arranged in one column along the longitudinal direction of the first rail 231 on the other side of the first rail 231.

The transporting unit 130 may transport the container 250 stored in the first storage unit 110 to be stored in the second storage unit 120 as described above. The transporting unit 130 may use the second moving control unit 343 for this purpose.

Specifically, the first sliding member 520 moves in the negative second direction (−20) to move onto the first storage unit 110k, which is any one of the plurality of first storage units 110a, 110b, ..., 110k, ..., 110n. Thereafter, when the container 250 is gripped by the gripping unit 341 and the gripping unit 341 descends and then rises by the first moving control unit 342, the first sliding member 520 may move in the positive second direction (+20) and move onto the second storage unit 120k, which is any one of the plurality of second storage units 120a, 120b, ..., 120k, ..., 120n. Thereafter, when the gripping unit 341 is lowered by the first moving control unit 342 and the gripping unit 341 releases the gripping of the container 250, it becomes possible for the container 250 to move from the first storage unit 110 to the second storage unit 120. In the present embodiment, the container 250 may be moved using the movement of the first sliding member 520 in the second direction 20 as described above.

In FIG. 8, it has been described that the plurality of second storage units 120a, 120b, ..., 120k, ..., 120n may be arranged in one column along the longitudinal direction of the first rail 231, like a plurality of first storage units 110a, 110b, ..., 110k, ..., 110n.

However, the present embodiment is not limited thereto. The plurality of second storage units 120a, 120b, ..., 120k, ..., 120n may be arranged in a plurality of columns, respectively, along the longitudinal direction of the first rail 231. When the plurality of second storage units 120a, 120b, ..., 120k, ..., 120n are formed in this way, the effect that the storage space of the container 250 is greatly expanded in the space 200, in which the semiconductor manufacturing facility 240 is built, can be obtained.

The plurality of second storage units 120a, 120b, ..., 120k, ... 120n may be arranged in two columns along the longitudinal direction of the first rail 231, for example, as shown in FIG. 9. FIG. 9 is a second exemplary diagram illustrating an arrangement structure when a plurality of first and second storage units constituting a container storage system according to an embodiment of the present invention are provided.

The plate structure 510 and the first sliding member 520 may be formed to have a sufficient length in the second direction 20 by considering that a plurality of second storage units 120a, 120b, ..., 120k, ..., 120n can be arranged in a plurality of columns as shown in the example of FIG. 9.

However, the present embodiment is not limited thereto. The second moving control unit 343 may be configured in multiple stages by including a plurality of sliding members on the plate structure 510. The second moving control unit 343 may include, for example, a first sliding member 520 and a second sliding member 530 on the plate structure 510 as shown in FIG. 10.

FIG. 10 is a second exemplary diagram schematically illustrating an internal structure of a second moving control unit constituting the transporting unit shown in FIG. 5. The following description refers to FIG. 10.

The second sliding member 530 may be installed to be movable in the second direction 20 on the first sliding member 520. At least one such second sliding member 530 may be provided in this embodiment. When a plurality of second sliding members 530 are provided, the plurality of second sliding members 530 may be stacked and installed to be movable in the second direction 20.

The first sliding member 520 and the second sliding member 530 may move on the plate structure 510 in the same direction (e.g., a positive second direction (+20)). However, the present embodiment is not limited thereto. The first sliding member 520 and the second sliding member 530 may move in different directions (e.g., the negative second direction (−20) and the positive second direction (+20)) on the plate structure 510.

Meanwhile, in FIGS. 8 and 9, the case where the rail formed in the space 200, in which the semiconductor manufacturing facility 240 is built, is the first rail 231 has been described. However, the present embodiment is not limited thereto. Even when the rails formed in the space 200, in which the semiconductor manufacturing facility 240 is built, are the second rail 232 and the third rail 233, the contents of FIGS. 8 and 9 may be equally applied.

On the other hand, when the plurality of second storage units 120a, 120b, ..., 120k, ..., 120n are respectively arranged in a plurality of columns along the longitudinal direction of the first rail 231, a plurality of second storage units 120a, 120b, ..., 120k, ..., and 120n arranged in each column may be formed to have the same height in the space 200, in which the semiconductor manufacturing facility 240 is built.

For example, when the plurality of second storage units 120a, 120b, ..., 120k, ..., and 120n are arranged in three columns, the second storage unit 120l located in the first column, the second storage unit 120m located in the second column and the third storage unit 120n located in the third column may be formed to have the same height. FIG. 11 is a first exemplary diagram illustrating an installation environment of a second storage unit constituting a container storage system according to an embodiment of the present invention.

However, the present embodiment is not limited thereto. It is possible that a plurality of second storage units 120a, 120b, ..., 120k, ..., 120n arranged in each column are formed to have different heights, or a plurality of second storage units 120a, 120b, ..., 120k, ..., 120n arranged in several columns are formed to have the same height and a plurality of second storage units 120a, 120b, ..., 120k, ..., 120n arranged in several different columns are formed to have different heights For example, when the plurality of second storage units 120a, 120b, ..., 120k, ..., 120n are arranged in three columns, the second storage unit 120l located in the first column and the second storage unit 120l located in the second column may be formed to have the same height, and the second storage unit 120n located in the third column may be formed to have different height. FIG. 12 is a second exemplary diagram illustrating an installation environment of a second storage unit constituting a container storage system according to an embodiment of the present invention.

It will be described again with reference to FIG. 1.

The control unit 140 controls the transporting unit 130. The control unit 140 may control the transporting unit 130 by transmitting and receiving information in a wired/wireless manner.

The control unit 140 may include a processor with a calculation function, a control function, etc., a memory with a storage function, a communication module with a wired/wireless communication function, a power supply for supplying power, and various parts necessary for operation. The control unit 140 may be implemented by, for example, a computer or a server.

Next, an operation method of the control unit 140 will be described.

FIG. 13 is an exemplary diagram for describing a method of operating a control unit constituting a container storage system according to an embodiment of the present invention. The following description refers to FIG. 13.

Hereinafter, the case where a plurality of first storage units 110a, 110b, ..., 110k, ..., 110n are configured in a first column (610) on one side of the first rail 231, a plurality of second storage units 120b, ..., 120k, ..., 120n are configured in a second column 620 and a third column 630 on the other side of the first rail 231 will be described as an example, but the present embodiment is not limited thereto.

The control unit 140 may control the transporting unit 130 to move the container 250 stored in the first storage unit 110 to the second storage unit 120 and store it in the second storage unit 120.

When the containers 250 are stored in all of the plurality of first storage units 110a, 110b, ..., 110k, ..., 110n constituting the first column 610 or the container 250 is not stored in any one, and the storage space is insufficient, the control unit 140 may move the container 250 stored in the first storage unit 110 to the second storage unit 120. At this time, the control unit 140 may move a container stored in the first storage unit (e.g., 110k) corresponding to the interface unit among the plurality of first storage units 110a, 110b, ..., 110k, ..., 110n to the second storage unit 120. The first storage unit corresponding to the interface unit may be any one of the plurality of first storage units 110a, 110b, ..., 110k, ..., 110n, but may also be a plurality.

That is, the control unit 140 may move the containers 250 stored in the plurality of first storage units 110a, 110b, ..., 110k, ..., 110n to a plurality of second storage units 120a, 120b, ..., 120k, ..., 120n constituting the second column 620 or a plurality of second storage units 120a, 120b, ..., 120k, ..., 120n constituting the third column 630 in consideration of the storage position of the container 250.

However, the present embodiment is not limited thereto. The control unit 140 also may move the containers 250 stored in the plurality of first storage units 110a, 110b, ..., 110k, ..., 110n to a plurality of second storage units 120a, 120b, ..., 120k, ..., 120n constituting the second column 620 or a plurality of second storage units 120a, 120b, ..., 120k, ..., 120n constituting the third column 630 in consideration of the storage order of containers 250, the processing order of the containers 250, etc.

Meanwhile, when the container 250 is stored in the first storage unit corresponding to the interface unit, the control unit 140 may transport the container 250 to the second storage unit 120 using the transporting unit 130.

When the storage order of the container 250 is taken into consideration, the control unit 140 may move the container 250 last stored in any one of the plurality of first storage units 110a, 110b, ..., 110k, ..., 110n.

However, the present embodiment is not limited thereto. The control unit 140 may move the container 250 first stored in any one of the plurality of first storage units 110a, 110b, ..., 110k, ..., 110n.

Meanwhile, when the processing order of the container 250 is taken into consideration, the control unit 140 may move the container 250, in which the substrates to be processed the latest are accommodated.

On the other hand, when moving the container 250 to a plurality of second storage units 120a, 120b, ..., 120k, ..., 120n constituting the second column 620 or to a plurality of second storage units 120a, 120b, ..., 120k, ..., 120n constituting the third column 630, the control unit 140 may store first the container 250 in a plurality of second storage units 120a, 120b, ..., 120k, ..., 120n constituting the third column 630.

However, the present embodiment is not limited thereto. The control unit 140 also may store the container 250 requiring long-term storage in the plurality of second storage units 120a, 120b, ..., 120k, ..., 120n constituting the third column 630, and store the container 250 requiring short-term storage in the plurality of second storage units 120, 120b, ..., 120k, ..., 120n constituting the second column 620.

On the other hand, the first storage unit 110, the second storage unit 120, and the transporting unit 130 each may be installed at a lower position than the sprinkler so that early fire suppression is possible by the sprinkler installed on the ceiling 420 when a fire occurs in the space 200, in which the semiconductor manufacturing facility 240 is built.

The container storage system 100 according to an embodiment of the present invention has been described above with reference to FIGS. 1 to 13. The container storage system 100 installs a loader and a storage in addition to the side track buffer (STB) storage method, and utilizes the upper dead zone space of the facility in the current bay for the purpose of greatly expanding the logistic transporting item storage capacity.

The characteristics of the container storage system 100 are summarized as follows.

First, it is a system structure that increases the storage capacity in the semiconductor FAB by additionally installing a loader and storage, and brings OHT and logistics transport efficiency through control through the upper system.

Second, it is a structure that can utilize the dead zone space in the upper portion of the facility.

Third, the loader may have a stroke that can support the storage in the second column storage.

Fourth, loaders and storage can be installed on the side of the OHT rail and side track buffer.

Fifth, the first column of the storage may be installed in the lower portion of the loader.

Sixth, the storage may have a structure that is flexible in design and manufacture according to layout and space utilization.

Seventh, it can have the same loader rail installation structure as the OHT rail.

Eighth, it can have a structure capable of operating separately interlocked/non-interlocked with the OHT rail upper control system.

According to the present invention, the following effects can be obtained.

First, the storage capacity can be increased, and the storage density can be improved.

Second, it is possible to utilize the dead zone space in the upper portion of the facility.

Third, it is possible to reduce the stocker, which is a storage facility installed on the bottom surface.

Although embodiments of the present invention have been described with reference to the above and the accompanying drawings, those of ordinary skill in the art to which the present invention pertains can understand that the present invention can be practiced in other specific forms without changing its technical spirit or essential features. Therefore, it should be understood that the embodiments described above are illustrative in all respects and not limiting.

What is claimed is:

1. A system for storing a container comprising:
   a first storage unit installed on a side of a movement path of a transporting device for transporting a container accommodating a substrate and for storing the container;
   a second storage unit installed on a side of the first storage unit and for storing the container; and
   a transporting unit moving between the first storage unit and the second storage unit and for transporting the container stored in the first storage unit to the second storage unit,
   wherein an upper portion of a space, in which a semiconductor manufacturing facility is built, includes a first area and at least one second area arranged outside the first area, and
   wherein the second storage unit is installed in the second area.

2. The system of claim 1, wherein the second storage unit is installed in an upper portion of a semiconductor manufacturing facility in a space, in which the semiconductor manufacturing facility is built.

3. The system of claim 1, wherein the second area is arranged on both sides of the first area, or is arranged on a periphery of the first area.

4. The system of claim 1, wherein the second storage unit is arranged along at least one column,
   wherein the transporting unit transports the container using a stroke.

5. The system of claim 1, wherein the transporting unit transports the container by using a movement path of the transporting device.

6. The system of claim 1, wherein the transporting unit transports the container when there is no or one first storage unit, in which the container is stored, among a plurality of first storage units.

7. The system of claim 1, wherein a plurality of second storage units are arranged along a plurality of columns,
   wherein the transporting unit first transports the container to a second storage unit located in an outer column.

8. The system of claim 1, wherein a plurality of second storage units are arranged along a plurality of columns,
   wherein the transporting unit transports a container for long term storage to a second storage unit located in an outer column, and transports a container for short term storage to a second storage unit located in an inner column.

9. The system of claim 1, wherein the transporting unit transports the container based on any one of a storage location of the container, a storage order of the container, and a processing order of the container.

10. The system of claim 1, wherein the first storage unit, the second storage unit, and the transporting unit are installed at a lower position than a sprinkler in a space, in which a semiconductor manufacturing facility is built.

11. The system of claim 1, wherein a plurality of second storage units are arranged along a plurality of columns,
    wherein a second storage unit arranged along any one of the plurality of columns is formed to have a different height from a second storage unit arranged along other one of the plurality of columns.

12. The system of claim 11, wherein the transporting unit is installed in an upper portion of a second storage unit arranged along any one of the plurality of columns.

13. A system for storing a container comprising:
    a first storage unit installed on a side of a movement path of a transporting device for transporting a container accommodating a substrate and for storing the container;
    a second storage unit installed on a side of the first storage unit and for storing the container; and
    a transporting unit moving between the first storage unit and the second storage unit, and for transporting the container stored in the first storage unit to the second storage unit,
    wherein at least one unit of a plurality of first storage units is an interface unit, and
    wherein the transporting unit transports the container to the second storage unit when the container is stored in the interface unit.

14. An apparatus for transporting a container moving between a first storage unit installed on a side of a movement path of a transporting device and a second storage unit installed on a side of the first storage unit,
    wherein the apparatus comprising:
    a driving wheel rotating along a rail;
    a driving control unit coupled to the driving wheel on its both sides and for controlling the driving wheel; and
    a body unit coupled to a lower portion of the driving control unit and including a gripping unit for gripping the container, a first moving control unit for moving the gripping unit in upward and downward directions, and a second moving control unit for moving the gripping unit in a lateral direction,
    wherein the container stored in the first storage unit is transported to the second storage unit using a stroke of the second moving control unit, and
    wherein the transporting unit comprises,
    a driving wheel that rotates along a rail;

a driving control unit coupled to the driving wheel on its both sides and for controlling the driving wheel; and a body unit coupled to a lower portion of the driving control unit and including a gripping unit for gripping the container, a first moving control unit for moving the gripping unit in upward and downward directions, and a second moving control unit for moving the gripping unit in a lateral direction, and wherein the second moving control unit comprises, a plate structure elongated in the lateral direction; and a first sliding member installed to be movable in the lateral direction on the plate structure.

15. The system of claim 14, wherein the second moving control unit further comprises a second sliding member installed to be movable in the lateral direction on the first sliding member.

16. The system of claim 15, wherein at least one second sliding member is installed on the first sliding member, wherein a plurality of second sliding members are stacked and installed to be movable in the lateral direction when the plurality of second sliding members are installed on the first sliding member.

* * * * *

UNITED STATES PATENT AND TRADEMARK OFFICE
CERTIFICATE OF CORRECTION

PATENT NO. : 12,240,701 B2  
APPLICATION NO. : 17/474285  
DATED : March 4, 2025  
INVENTOR(S) : Jun Sang Ahn, Sun Oh Kim and Chan Young Noh Page 1 of 1

It is certified that error appears in the above-identified patent and that said Letters Patent is hereby corrected as shown below:

In the Claims

In Column 14, Line 66 in Claim 14 the word "wherein the transporting unit comprises," should read -- a transporting unit comprising, --.

In Column 15, Line 14 in Claim 15 the word "system" should read -- apparatus --.

In Column 15, Line 18 in Claim 16 the word "system" should read -- apparatus --.

Signed and Sealed this  
Tenth Day of June, 2025

Coke Morgan Stewart  
*Acting Director of the United States Patent and Trademark Office*